United States Patent
Goel et al.

(10) Patent No.: US 6,794,906 B2
(45) Date of Patent: Sep. 21, 2004

(54) DECODER SCHEME FOR MAKING LARGE SIZE DECODER

(75) Inventors: Ashish Kumar Goel, Uttar Pradesh (IN); Manish Agarwal, Uttar Pradesh (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 10/269,166

(22) Filed: Oct. 10, 2002

(65) Prior Publication Data

US 2004/0070424 A1 Apr. 15, 2004

(30) Foreign Application Priority Data

Oct. 10, 2002 (IN) ...................................... 1040/Del/2001

(51) Int. Cl.[7] .......................... G11C 8/10; H03K 19/094
(52) U.S. Cl. ...................................... 326/113; 326/106
(58) Field of Search ................................ 326/113, 105, 326/106, 107, 108

(56) References Cited

U.S. PATENT DOCUMENTS 4,491,839 A * 1/1985 Adam ........................ 376/121
5,438,295 A * 8/1995 Reddy et al. ................ 327/408

OTHER PUBLICATIONS

IBM Technical Disclosure Bulletin, "Matrix Decoder", Jun. 1974, TDB–ACC–NO: NN7406280, pp. 1–4.*
IBM Technical Disclosure Bulletin, "Matrix Decoder", Jan. 1976, TDB–ACC–NO: NN76012577, pp. 1–4.*

* cited by examiner

Primary Examiner—Daniel D. Chang
(74) Attorney, Agent, or Firm—Lisa K. Jorgenson; P. G. Scott Born; Graybeal Jackson Haley LLP

(57) ABSTRACT

An improved multi-stage binary hierarchy decoder characterized in that at least one of the decoding stages subsequent to the first stage is implemented as a Transmission Gate Matrix (TGM) in which a single transmission gate enables an active input from the previous stage to its output, thereby resulting in reduced area requirements when implemented as an integrated circuit.

18 Claims, 8 Drawing Sheets

DECODER 2X4 (100)

DECODER 2X4 (200)

TRANSMISSION GATE MATRIX

DECODER SCHEME FOR MAKING LARGE SIZE DECODER

CROSS-REFERENCE TO RELATED APPLICATION

This application claims priority from Indian patent application No. 1040/Del/2001, filed Oct. 10, 2002; and is herein incorporated by reference.

FIELD OF THE INVENTION

The present invention relates to an improved multistage binary hierarchy decoder for large number of outputs using smaller size decoders and a pass gate matrix.

BACKGROUND OF THE INVENTION

FIG. 1 shows an example of a 2×4 decoder with active low outputs. The decoder has two inputs (1.1) and (1.2) and 4 outputs (1.3) to (1.6). FIG. 2 defines another implementation of 2×4 decoder, which has active high outputs. The 2 inputs are (2.1) and (2.2) while the outputs are (2.3) to (2.6). These decoders are examples of flat decoders. However, this approach is not suitable for larger decoders, as it requires substantial hardware. In such cases multi-stage decoders are used to reduce the hardware required. As an example, a 4×16 decoder can be made using two 2×4 decoders. There are several schemes for two stage decoding. One such scheme is shown in FIG. 3. Here two decoders of the type shown in FIG. 1 are used as a first stage of the decoder with inputs (3.1) and (3.2) for the first decoder and inputs (3.3) and (3.4) for the second decoder. In the second stage of the decoder each output from each 2×4 decoder is NORed with each corresponding output of the second 2×4 decoder forming a 4×16 decoder with outputs OUT0 through OUT15. This decoder provides active high outputs.

For making a decoder with active low outputs, the decoder of FIG. 2 can be used as the first stage of the decoder and in the second stage each output of the first 2×4 decoder will be NANDed with each corresponding output of the second 2×4 decoder to form the 4×16 decoder. Even such two stage decoder schemes consume a lot of hardware and are hence not suitable for making very large size decoders.

THE SUMMARY OF THE INVENTION

Accordingly, one embodiment of the present invention provides an apparatus and method for overcoming the above drawbacks for making large size decoders by using a binary hierarchy of smaller size decoders together with a pass gate matrix.

This embodiment is an improved multi-stage binary hierarchy decoder characterized in that at least one of the decoding stages subsequent to the first stage is implemented as a Transmission Gate Matrix (TGM) in which a single transmission gate enables an active input from the previous stage to its output, thereby resulting in reduced area requirements when implemented as an integrated circuit.

The TGM is an arrangement of transmission gates in row and column form with the gates of all transmission gates in the same column connected together to a single output from a first decoder from the previous stage, while the inputs of all transmission gates in the same row are connected together to a single output of the second decoder from the previous stage.

A discharge matrix is included at the output of the TGM for the case when the outputs are active high in order to pull inactive outputs low, while a charge matrix is included at the output of the TGM for the case of active low outputs in order to pull inactive outputs high.

The discharge matrix is an arrangement of grouped NMOS transistors having source terminals connected to ground, gate terminals of each group connected to a corresponding input from a decoder of the previous stage that is used to drive gate terminals of transmission gates in the TGM and each drain connected to an output from the TGM.

The charge matrix is an arrangement of grouped PMOS transistors having source terminals connected to the positive supply terminal, gate terminals of each group connected to a corresponding input from a decoder of the previous stage that is used to drive gate terminals of transmission gates in the TGM, and each drain connected to an output from the TGM.

BRIEF DESCRIPTION OF THE ACCOMPANYING DRAWINGS

The invention will now be described with reference to the accompanying drawings

DETAILED DESCRIPTION OF THE EMBODIMENTS OF THE INVENTION

Figure 1:
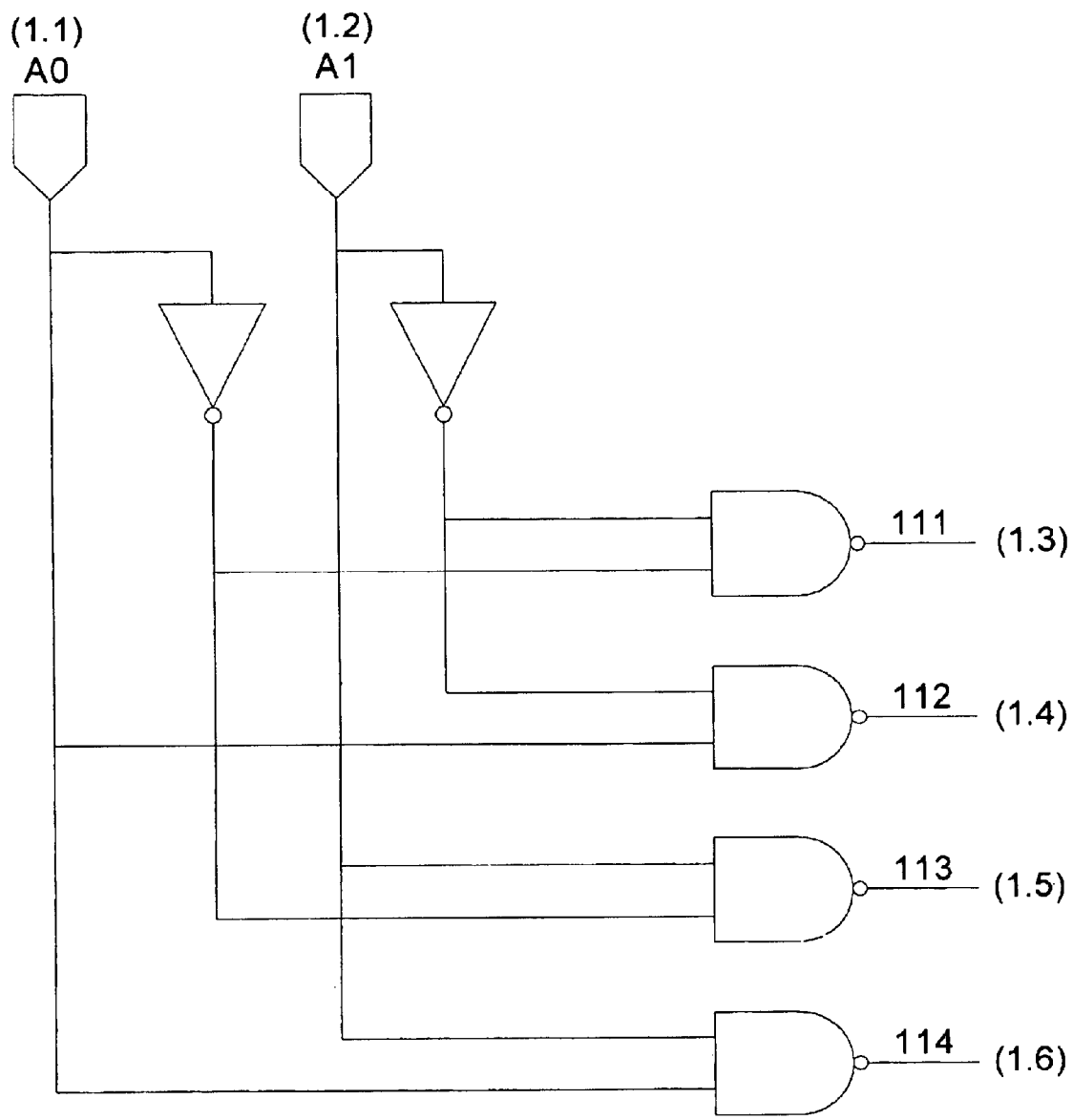
FIG. 1 shows a design of a conventional 2×4 decoder with active low outputs using NAND gates.
Figure 2:
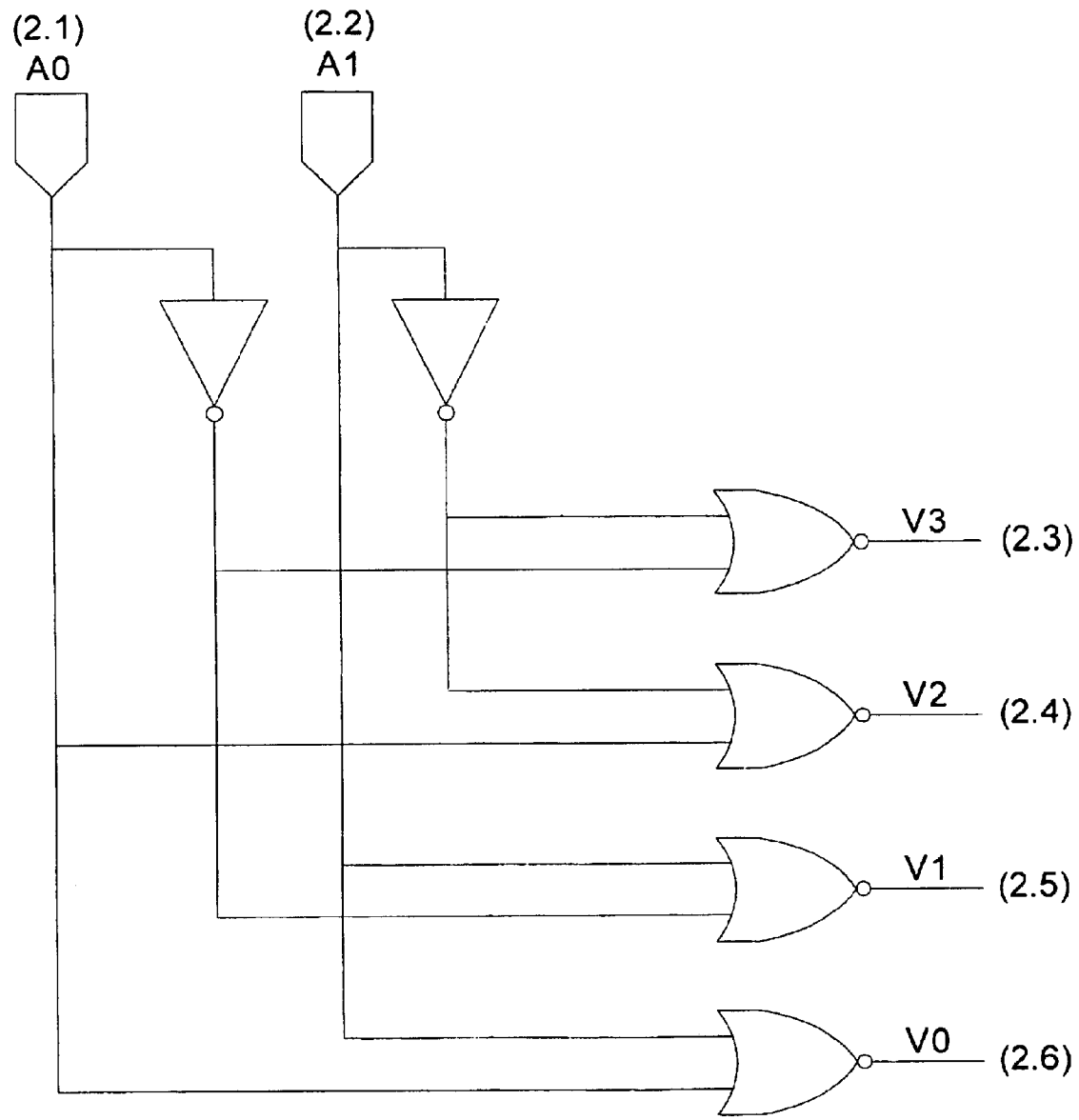
FIG. 2 shows a design of a conventional 2×4 decoder with active high outputs using NOR gates.
Figure 3:
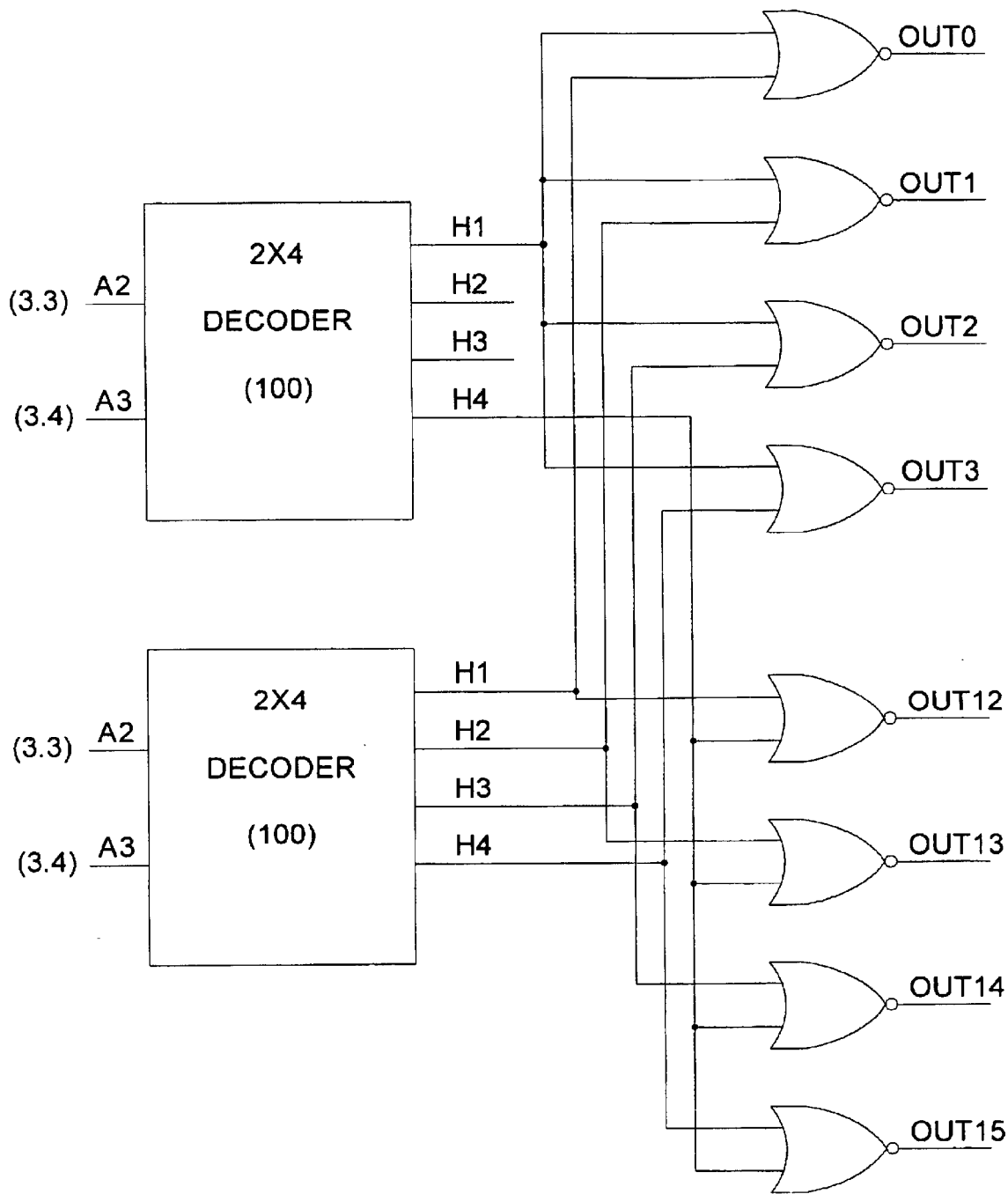
FIG. 3 shows a conventional 2-stage 4×16 decoder.

FIGS. 1, 2 & 3 have been described in the background of the invention.

Figure 4:
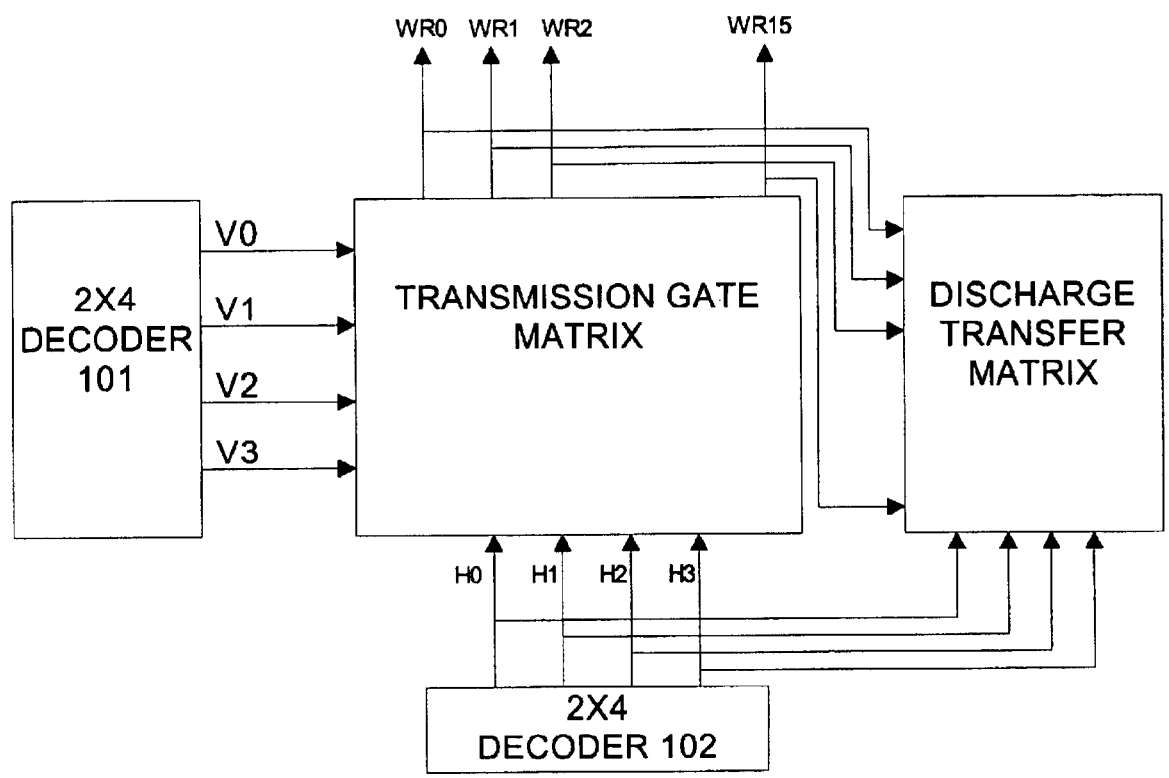
FIG. 4 shows a block diagram of an embodiment of the invention.

FIG. 4 shows a block diagram of an embodiment of the invention for an example of a 4×16 decoder using two 2×4 decoders. A pass gate array is used as a cross-connect for the two decoders.

One of the two stage-1 decoders (4.1) provides active low outputs which are connected to the 4 horizontal input lines H0 to H3 of the TGM (4.3). The other stage-1 decoder (4.2) provides active high outputs that are connected to the 4 vertical input lines V0 to V3 of the TGM (4.3). The combination of horizontal and vertical inputs is used to select one of the transmission gates (located at the intersection of the active horizontal and vertical inputs) inside the TGM (4.3) and provide an active high output on one of the 16 output lines WR0 to WR15. A discharge transistors matrix (4.4) controlled by the 4 outputs from decoder (4.1) is used to pull-down the inactive TGM outputs to a well-defined inactive low level.

Figure 5:
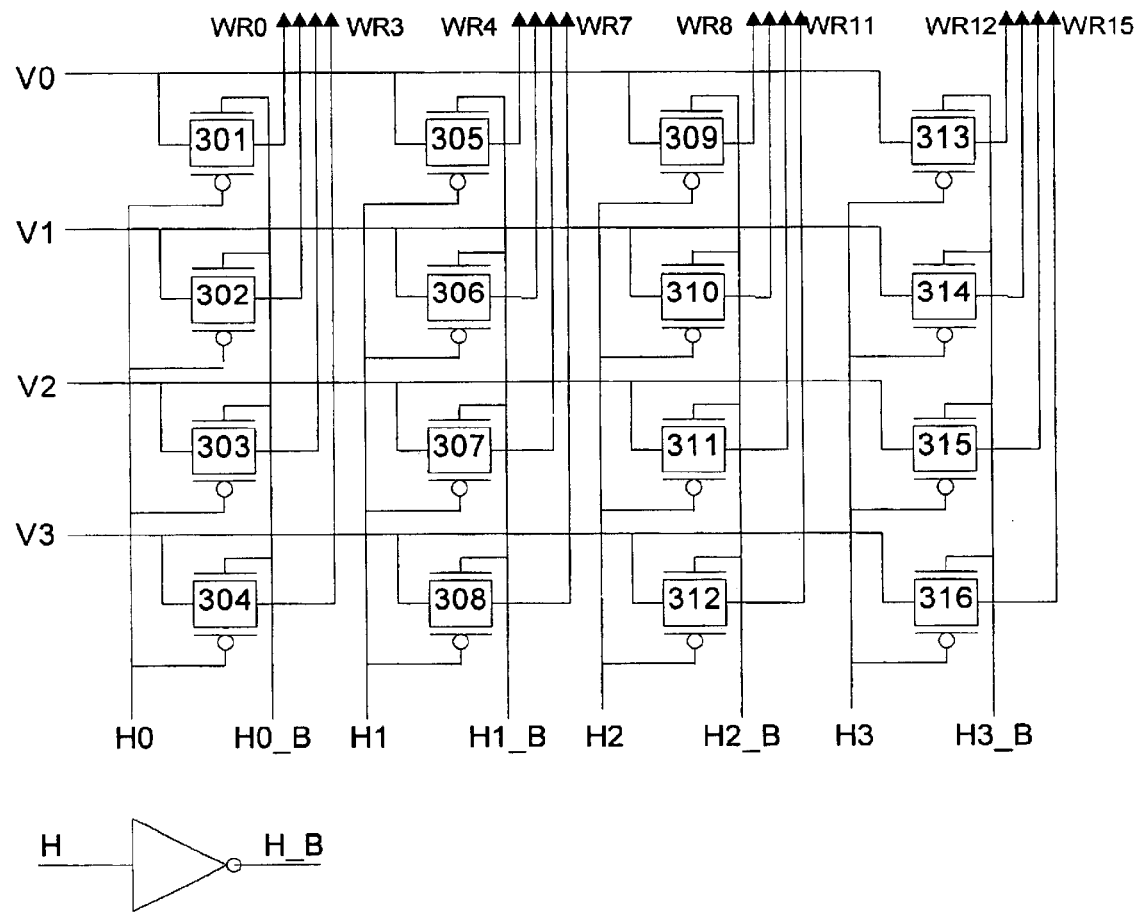
FIG. 5 shows a pass gate array used for implementing the decoder design according to an embodiment of the invention.

FIG. 5 shows the internal structure of the TGM. For the instant example of the 4×16 decoder, of FIG. 4 the 4 outputs from the first 2×4 decoder (4.1) are applied to the horizontal input lines (H0–H3) while the 4 outputs from the other 2×4 decoder (4.2) are applied to the vertical inputs (V0–V3). The first 2×4 (4.1) decoder has active low outputs while the second 2×4 decoder has active high outputs. Depending on the input bit pattern, one output line of the horizontal decoder will go low and others will be high and one output line of the vertical decoder will be high while the others will be low. The gates of the transmission gate in each column of the matrix (301) to (304), (305) to (308), (309) to (312), and (313) to (316) are connected with the output signals and the compliment of the output signals from the horizontal decoder. The inputs of the transmission gates in each row of the matrix are joined together and connected to the vertical decoder. So the inputs of transmission gates (301), (305), (309), and (313) are joined and connected to the first output V0 of the vertical decoder, (302), (306), (310), and (314) to the second output, V1 (303), (307), (311), and (315) to the third output V2 and (304), (308), (312) and (316) to the final output V3.

For an input sequence of 0000 the H0 output will go low and V0 output will go high. Since only the H0 output of the horizontal decoder is low, pass gates 301–304 will be ON. Also since only V0 output of the vertical decoder is high, the input of pass-gates 301, 305, 309, and 313 will be at logic high. Pass gates 305, 309, and 313 are OFF so only gate 301 (which is at the cross-point of the H0 and V0) will pass logic high to its output. In other words, output 'wr0' will be active high. If the input sequence changes to 0001 then again H0 line will be low but now V1 line go high and gate 302 (cross-point of V1 and H0) will pass a high so this time only 'wr1' will go active high. Similarly, if the input sequences changes to 0101 then H1 will go low and V1 will go high. This time pass gates 305 to 308 will be ON and logic high will be at the input of 302, 306, 310, and 314. Only pass gate 306 (cross-point of the V1 and H1) will provide an output high setting output line 'wr5' high. The outputs of the transmission gates that are OFF need to be provided a defined level as these would be otherwise 'floating' at undefined levels. A discharge matrix provides a solution.

Figure 6:
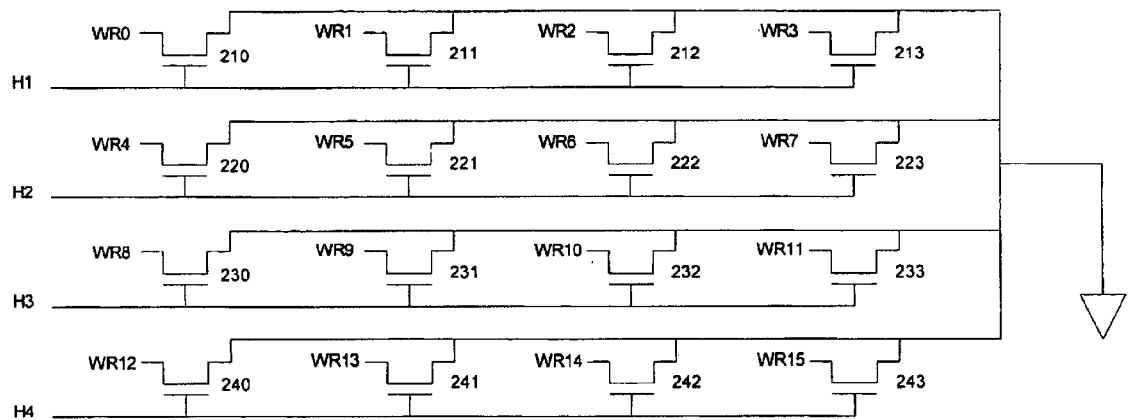
FIG. 6 shows discharge transistor matrix according to an embodiment of the invention.

FIG. 6 shows the structure an embodiment of the discharge matrix according to an embodiment of the invention. The output lines of the TGM 'wr0' to 'wr15' are connected to the drains of individual NMOS transistors in the discharge matrix (210) to (213), (220) to (223), (230) to (233), and (240) to (243). The gates of NMOS transistors 210–213 are joined together and connected to H0 horizontal outputs, NMOS transistors 220–223 gates are connected to H1, NMOS transistors 230–233 gates are connected to H2 and NMOS transistors 240–243 gates are connected to H3. The source of all the NMOS transistors is connected to the ground. Since the horizontal decoder provides active low outputs, only one row of NMOS transistors (those connected to the active horizontal signal) will be OFF while the others will be ON at any time. The ON NMOS transistors will hold the output lines of the OFF transmission gates of the TGM at logic 0. When the input sequence is at 0001, H0 is low and the rest are high. At this time, NMOS transistors 210–213 are OFF and the rest are ON. So output lines wr4–wr15 are pulled low. If, now, the input sequence changes to the 0101, then H0 will go high and previously high wr1 line will discharge through NMOS transistor 211. At this time, H1 line will be low and NMOS transistors 220–223 will be OFF.

Figure 7:
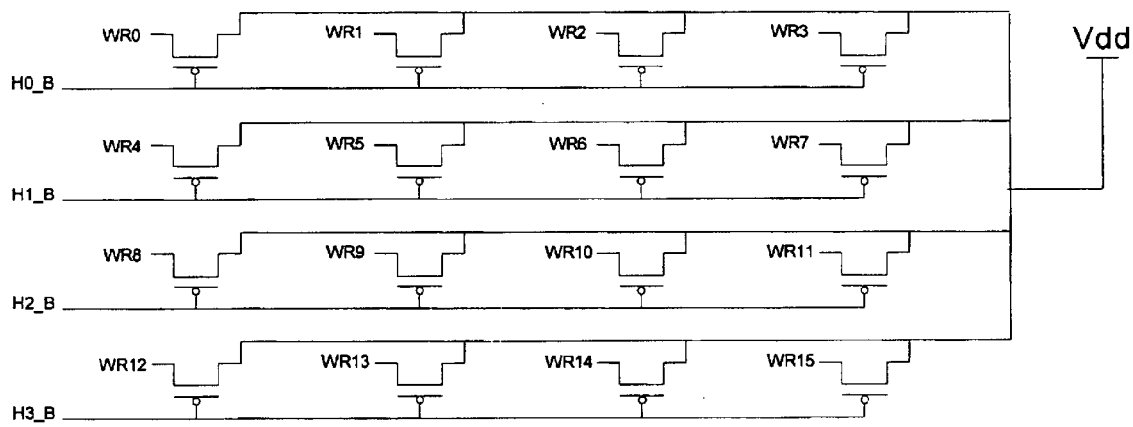
FIG. 7 shows a charge transistor matrixin the case of a decoder with active low outputs according to an embodiment of the invention.

For the case of a decoder with active low outputs, the horizontal decoder needs to be made an active high output type, the vertical decoder an active low output type, and the discharge matrix needs to be replaced by a charge matrix. FIG. 7 shows a diagram of a charge matrix according to an embodiment of the invention. The charge matrix is similar to the discharge matrix with the NMOS transistors replaced by PMOS transistors having sources connected to the positive supply.

Again, only one row of the PMOS transistors will be OFF and rest will be ON, which will pull the outputs connected to them high. The outputs, which are connected to an OFF PMOS transistor row, will reflect the value of vertical decoder output (this particular column will be ON in pass gate array). Since only one output of the vertical decoder will be low in this configuration, only one output (which will be at the cross point of low output of the vertical decoder and the low output of the horizontal decoder) will go low and the rest will be high.

Figure 8:
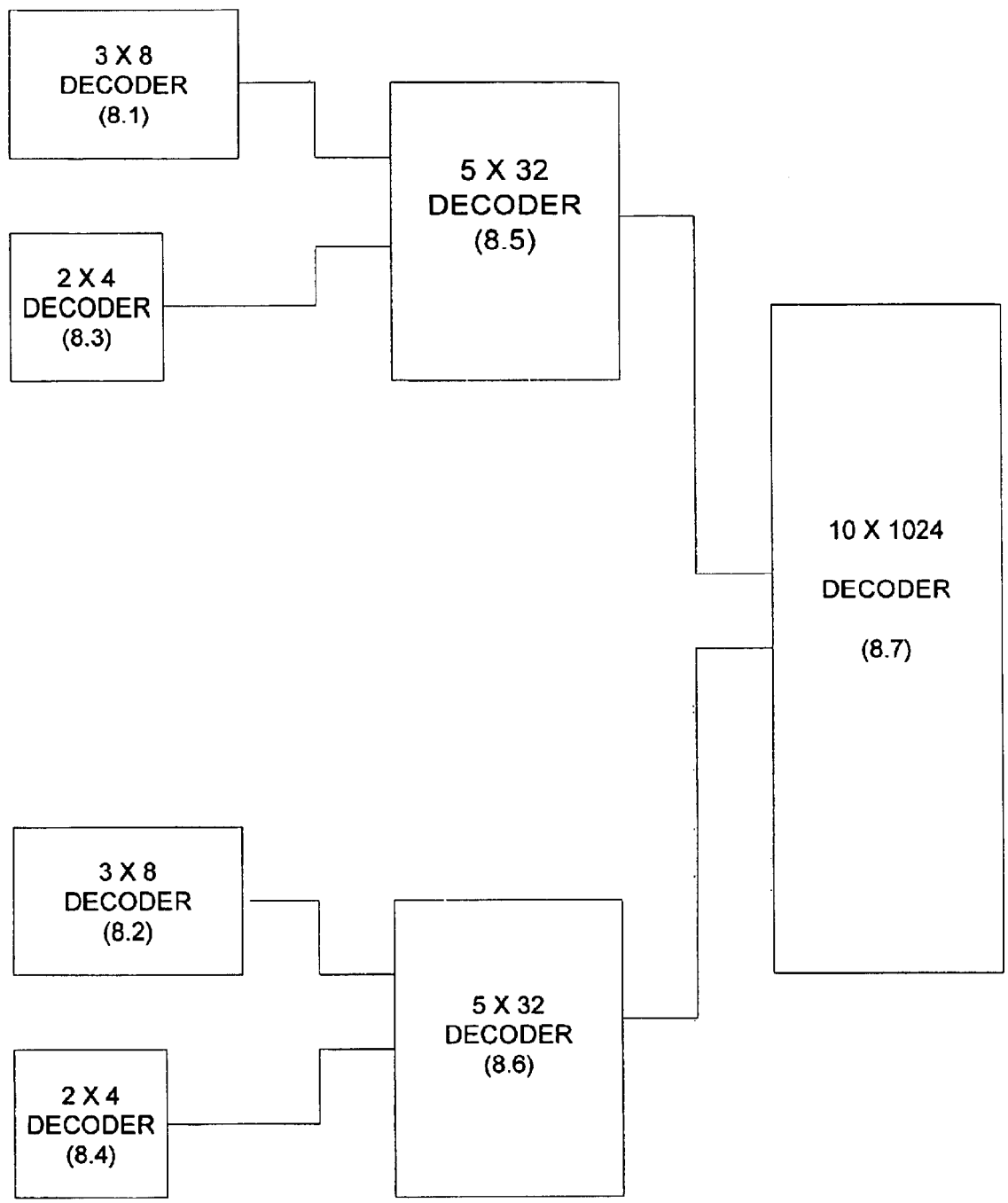
FIG. 8 shows an example of a conventional 10×1024 decoder using a hierarchical decoding structure.

FIG. 8 shows an example of a large 10×1024 decoder using conventional technology. This hierarchical structure uses a 3-stage design using a combination of 3×8 decoders (8.1) and (8.2), and 2×4 decoders (8.3) and (8.4) in the first stage, connected to two 5×32 decoders (8.5) and (8.6) in the second stage and a $10 \times 10^{24}$ decoder (8.7) in the final stage.

Figure 9:
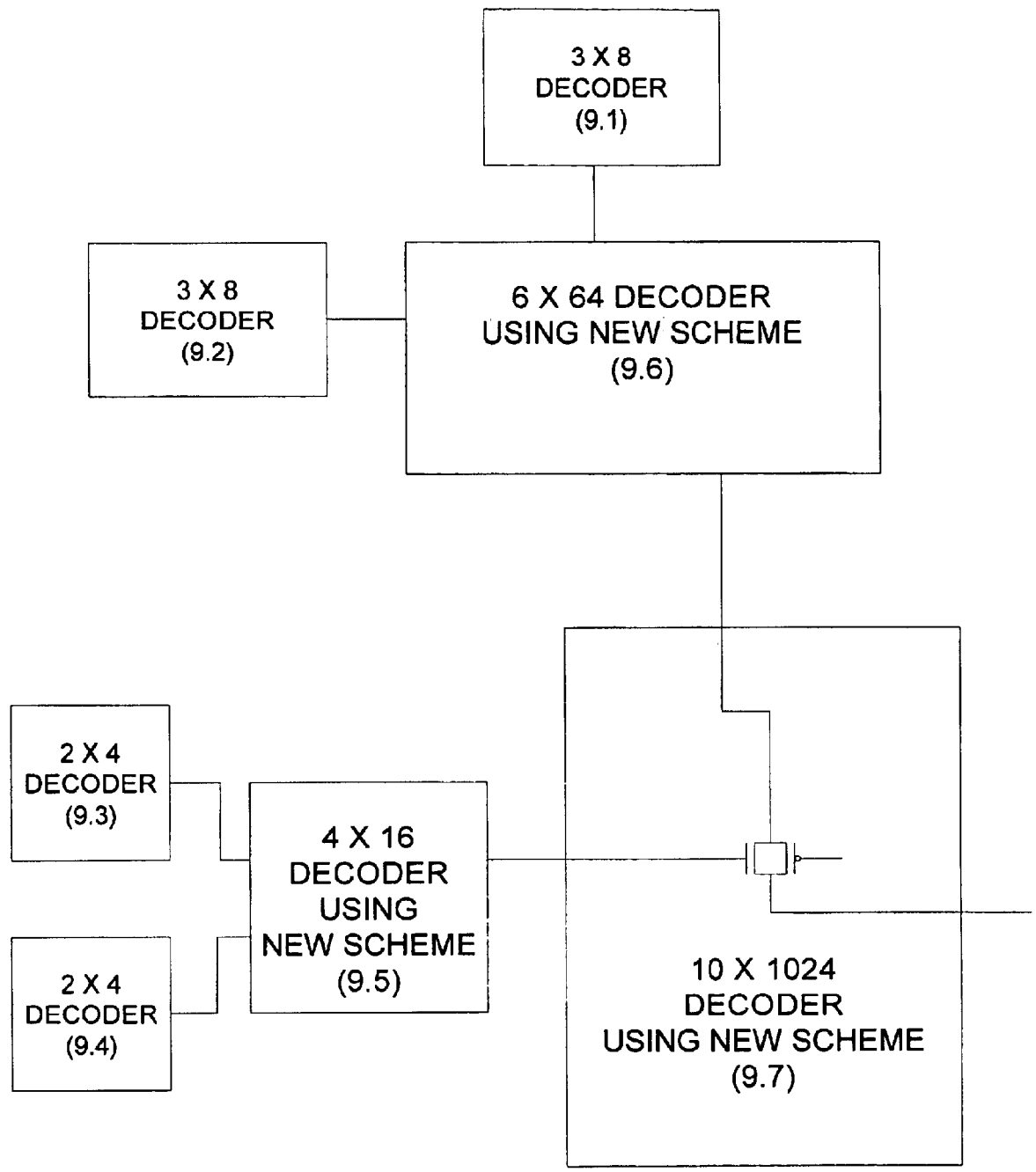
FIG. 9 shows a 10×1024 decoder based on a hierarchical decoding structure according to an embodiment of the invention.

FIG. 9 shows one of the possible implementations of a 10×1024 decoder according to an embodiment of the invention. The first stage comprises two 3×8 decoders (9.1) and (9.2) and two 2×4 decoders (9.3) and (9.4). The two 3×8 decoders connect to a 6×64 TGM (9.6) with associated charge matrix/discharge matrix (not shown) while the two 2×4 decoders connect to a 4×16 TGM (9.5) with associated charge matrix/discharge matrix (not shown). In the final stage, the outputs from the 6×64 TGM (9.6) and 4×16 TGM (9.5) are connected to a 10×1024 TGM (9.8) with associated charge matrix/discharge matrix (not shown).

Accordingly, this invention is not to be considered limited to the specific examples chosen for purposes of disclosure, but rather to cover all changes and modifications that are within the spirit and scope of the present invention. The invention is therefore not limited by the description contained herein or by the drawings.

We claim:

1. An improved multi-stage binary hierarchy decoder comprising at least one of the decoding stages subsequent to the first stage implemented as a transmission gate matrix in which a single CMOS transmission gate, having a control node and an input node, each of which is directly coupled to respective first stage output nodes, enables an active input from the previous stage to its output, thereby resulting in reduced area requirements when implemented as an integrated circuit.

2. An improved multi-stage binary hierarchy decoder comprising at least one of the decoding stages subsequent to the first stage implemented as a transmission gate matrix in which a single transmission gate enables an active input from the previous stage to its output, thereby resulting in reduced area requirements when implemented as an integrated circuit, wherein said transmission gate matrix is an arrangement of transmission gates in row and column form with the gates of all transmission gates in the same column connected together to a single output from a first decoder from the previous stage, while the inputs of all transmission gates in the same row are connected together to a single output of the second decoder from the previous stage.

3. An improved multi-stage binary hierarchy decoder comprising at least one of the decoding stages subsequent to the first stage implemented as a transmission gate matrix in which a single transmission gate enables an active input from the previous stage to its output, thereby resulting in reduced area requirements when implemented as an integrated circuit, wherein a discharge matrix is included at the output of said transmission gate matrix for the case when the outputs are active high in order to pull inactive outputs low.

4. An improved multi-stage binary hierarchy decoder comprising at least one of the decoding stages subsequent to the first stage implemented as a transmission gate matrix in which a single transmission gate enables an active input from the previous stage to its output, thereby resulting in reduced area requirements when implemented as an integrated circuit, wherein:

a discharge matrix is included at the output of said transmission gate matrix for the case when the outputs are active high in order to pull inactive outputs low; and said discharge matrix is an arrangement of grouped NMOS transistors having source terminals connected to ground, gate terminals of each group connected to a corresponding input from a decoder of the previous stage that is used to drive gate terminals of transmission gates in said transmission gate matrix and each drain connected to an output from said transmission gate matrix.

5. An improved multi-stage binary hierarchy decoder comprising at least one of the decoding stages subsequent to the first stage implemented as a transmission gate matrix in which a single transmission gate enables an active input from the previous stage to its output, thereby resulting in reduced area requirements when implemented as an integrated circuit, wherein a charge matrix is included at the output of said transmission gate matrix for the case of active low outputs in order to pull inactive outputs high.

6. An improved multi-stage binary hierarchy decoder comprising at least one of the decoding stages subsequent to the first stage implemented as a transmission gate matrix in which a single transmission gate enables an active input from the previous stage to its output, thereby resulting in reduced area requirements when implemented as an integrated circuit, wherein:

a charge matrix is included at the output of said transmission gate matrix for the case of active low outputs in order to pull inactive outputs high; and wherein said charge matrix is an arrangement of grouped PMOS transistors having source terminals connected to the positive supply terminal, gate terminals of each group connected to a corresponding input from a decoder of the previous stage that is used to drive gate terminals of transmission gates in said transmission gate matrix, and each drain connected to an output from said transmission gate matrix.

7. A multi-stage decoder comprising:

a first input stage operable to receive a first portion of a binary code and having a plurality of output nodes;

a second input stage operable to receive a second portion of the binary code and having a plurality of output nodes; and a transmission gate matrix coupled to the output nodes of the first and second stages and having a plurality of CMOS transmission gates, each gate having a control node directly coupled to a respective one of the first input stage output nodes, an input node directly coupled to a respective one of the second input stage output nodes, and an output node that corresponds to a unique value of the binary code.

8. The multi-stage decoder of claim 7 wherein:

the output nodes of the first input stage are active at a first logic level; and the output nodes of the second input stage are active at a second logic level.

9. The multi-stage decoder of claim 7 wherein the output nodes of the first and second input stage are active at the same logic level.

10. The multi-stage decoder of claim 7 wherein the first and second input stages each respectively comprise two input nodes and four output nodes.

11. A multi-stage decoder comprising:

a first input stage operable to receive a first portion of a binary code and having a plurality of output nodes;

a second input stage operable to receive a second portion of the binary code and having a plurality of output nodes;

a transmission gate matrix coupled to the output nodes of the first and second stages and having a plurality of transmission gates that each correspond to a unique value of the binary code; and a discharge matrix coupled to each output node of the transmission gate matrix and operable to pull the output nodes that are not activated to a low logic level.

12. A multi-stage decoder comprising:

a first input stage operable to receive a first portion of a binary code and having a plurality of output nodes;

a second input stage operable to receive a second portion of the binary code and having a plurality of output nodes;

a transmission gate matrix coupled to the output nodes of the first and second stages and having a plurality of transmission gates that each correspond to a unique value of the binary code; and a charge matrix coupled to each output node of the transmission gate matrix and operable to pull the output nodes that are not activated to a high logic level.

13. A multi-stage decoder, comprising:

a first input stage operable to receive a first portion of a binary code and having a plurality of output nodes;

a second input stage operable to receive a second portion of the binary code and having a plurality of output nodes;

a third input stage operable to receive a third portion of the binary code and having a plurality of output nodes;

a fourth input stage operable to receive a fourth portion of the binary code and having a plurality of output nodes;

a first transmission gate matrix coupled to the output nodes of the first and second stages and having a plurality of CMOS transmission gates, each gate having a control node directly coupled to a respective one of the first input stage output nodes, an input node directly coupled to a respective one of the second input stage output nodes, and an output node that corresponds to a respective value of a combination of the first and second portions of the binary code;

a second transmission gate matrix coupled to the output nodes of the third and fourth stages and having a plurality of CMOS transmission gates, each gate having a control node directly coupled to a respective one of the third input stage output nodes, an input node directly coupled to a respective one of the fourth input stage output nodes, and an output node that corresponds to a respective value of a combination of the third and fourth portions of the binary code; and a third transmission gate matrix coupled to the transmission gates of the first and second transmission gate matrices and having a plurality of transmission gates that each correspond to a respective value of the binary code.

14. The multi-stage decoder of claim 13 wherein:
   the first input stage comprises two input nodes and four output nodes;
   the second input stage comprises two input nodes and four output nodes;
   the third input stage comprises three input nodes and eight output nodes; and
   the fourth input stage comprises three input nodes and eight output nodes.

15. A method for decoding a binary code, the method comprising:
   driving a first output node with a first logic level in response to a first portion of the binary code having a first value;
   driving a second output node with a second logic level in response to a second portion of the binary code having a second value; and
   directly coupling the first output node to a third output node with a CMOS transmission gate in response to the second logic level.

16. The method of claim 15 wherein coupling the first output node comprises closing a transmission gate that is coupled to the first and third output nodes.

17. The method of claim 15, further comprising driving the third output node to an inactive logic level when the first portion of the binary code does not have the first value.

18. The method of claim 15, further comprising driving the third output node to an inactive logic level when the second portion of the binary code does not have the second value.

* * * * *

UNITED STATES PATENT AND TRADEMARK OFFICE
CERTIFICATE OF CORRECTION

PATENT NO.        : 6,794,906 B2                                        Page 1 of 1
APPLICATION NO. : 10/269166
DATED             : September 21, 2004
INVENTOR(S)       : Ashish Kumar Goel and Manish Agarwal It is certified that error appears in the above-identified patent and that said Letters Patent is hereby corrected as shown below:

In the Foreign Application Priority Data section Item [56], "Oct. 10, 2002" should be --Oct. 10, 2001--

Signed and Sealed this

Twenty-second Day of May, 2007

JON W. DUDAS
*Director of the United States Patent and Trademark Office*